US009696349B2

(12) United States Patent
Wang et al.

(10) Patent No.: US 9,696,349 B2
(45) Date of Patent: Jul. 4, 2017

(54) CURRENT SENSING SYSTEM (71) Applicant: General Electric Company, Schenectady, NY (US)

(72) Inventors: Ruxi Wang, Cohoes, NY (US); William Edward Burdick, Jr., Niskayuna, NY (US); Satish Prabhakaran, Albany, NY (US); Raymond John Nicholas, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 289 days.

(21) Appl. No.: 14/315,743

(22) Filed: Jun. 26, 2014

(65) Prior Publication Data

US 2015/0377929 A1    Dec. 31, 2015

(51) Int. Cl.
*G01R 15/20* (2006.01)
*G01R 15/18* (2006.01)
(Continued)

(52) U.S. Cl.
CPC ....... *G01R 15/181* (2013.01); *H01F 27/2804* (2013.01); *H05K 1/028* (2013.01);
(Continued)

(58) Field of Classification Search
CPC . G01R 1/20; G01R 1/22; G01R 11/06; G01R 19/20; G01R 33/0283; G01R 27/16; G01R 31/025; G01V 3/02; G01V 3/04; G01V 3/06; G01V 3/08; G01V 3/082; G01N 27/83; G01N 27/84; G01N 27/9046;
(Continued)

(56) References Cited

U.S. PATENT DOCUMENTS 4,253,079 A    2/1981  Brosh
4,706,020 A   11/1987  Viertl et al.
(Continued)

FOREIGN PATENT DOCUMENTS

WO    2007075617 A2    7/2007

OTHER PUBLICATIONS

A European Search Report and Opinion issued in connection with corresponding EP Application No. 15173084.3 dated Nov. 13, 2015.
(Continued)

*Primary Examiner* — Tung X Nguyen
*Assistant Examiner* — Robert P Alejnikov, Jr.
(74) *Attorney, Agent, or Firm* — Nitin N. Joshi (57) ABSTRACT A detecting unit is presented. The detecting unit includes a flexible circuit having a first side and a second side opposite the first side. The flexible circuit includes a plurality of cells defined therein, each of the plurality of cells having a first side and a second side respectively corresponding to the first side and the second side of the flexible circuit. Moreover, the flexible circuit includes a plurality of conductive windings disposed on at least one of the first and second sides of the plurality of cells. Further, the flexible circuit includes a stress reduction feature between each of the plurality of cells. Also, the detecting unit includes a sealing element configured to secure the flexible circuit in a stacked configuration. A sensing system and a method of making a detecting unit are also presented.

5 Claims, 9 Drawing Sheets (51) Int. Cl.
*H05K 1/02* (2006.01)
*H01F 27/28* (2006.01)
*H05K 1/16* (2006.01)
*H05K 3/28* (2006.01)

(52) U.S. Cl.
CPC ...... *H01F 2027/2809* (2013.01); *H05K 1/165* (2013.01); *H05K 3/282* (2013.01); *H05K 2201/055* (2013.01); *H05K 2201/097* (2013.01); *H05K 2201/09036* (2013.01); *H05K 2201/09063* (2013.01); *H05K 2201/10151* (2013.01); *H05K 2201/2045* (2013.01); *H05K 2203/0191* (2013.01); *H05K 2203/0221* (2013.01); *H05K 2203/0228* (2013.01); *H05K 2203/107* (2013.01)

(58) Field of Classification Search
CPC ............ H01F 17/0006; H01F 17/0013; H01F 17/0033; H01F 2017/002; H01F 2017/0026; H01F 2017/004; H01F 2017/0046; H01F 2017/0053; H01F 2017/006; H01F 2017/0066; H01F 2017/0086; H01F 2017/0093; H01F 2027/2809; H01F 2027/2814
USPC ..... 324/117 R, 348, 354, 263, 156; 336/200, 336/206–208, 232; 361/600
See application file for complete search history.

(56) References Cited

U.S. PATENT DOCUMENTS

| | | | |
|---|---|---|---|
| 5,349,744 A * | 9/1994 | Takahashi | G01R 33/3858 29/602.1 |
| 5,442,280 A | 8/1995 | Baudart | |
| 5,994,703 A * | 11/1999 | Arai | H01J 3/32 250/396 ML |
| 6,313,623 B1 | 11/2001 | Kojovic et al. | |
| 6,731,193 B2 | 5/2004 | Meier et al. | |
| 6,965,225 B2 | 11/2005 | De Buda | |
| 7,071,685 B2 | 7/2006 | Saltsov et al. | |
| 7,106,162 B2 | 9/2006 | Saito | |
| 7,227,442 B2 | 6/2007 | Skendzic | |
| 7,746,068 B2 | 6/2010 | Mahon | |
| 7,902,812 B2 | 3/2011 | Kojovic | |
| 2007/0157828 A1* | 7/2007 | Susel | H01F 5/04 101/35 |
| 2008/0238600 A1* | 10/2008 | Olson | H01F 17/0006 336/180 |
| 2012/0249281 A1 | 10/2012 | Campbell et al. | |
| 2013/0101872 A1* | 4/2013 | Yang | H01M 4/64 429/7 |
| 2013/0207640 A1* | 8/2013 | Hammond | G01R 33/07 324/117 H |
| 2013/0300435 A1* | 11/2013 | Chi | G01R 19/0023 324/658 |

OTHER PUBLICATIONS

Kojovic, "PCB Rogowski Coils—High Precision Low Power Sensors", Cigre A3-102, pp. 1-8, 2004.
Qing et al., "Rogowski Sensor for Plasma Current Measurement in J-TEXT", Sensors Journal, IEEE (vol. 9 , Issue: 3), pp. 293-296, Mar. 2009.
Arcega et al., "Current Sensor Based on Rogowski Coil", Department of Electrical Engineering, pp. 1-4.

* cited by examiner

CURRENT SENSING SYSTEM

BACKGROUND

Embodiments of the present disclosure generally relate to a sensing system and more specifically to a modular current sensing system made from a flexible circuit.

Conventionally, different current sensing devices have been used for measuring currents in industrial applications. These current sensing devices include but are not limited to a current shunt, a current transformer, and a Hall Effect sensor. Each of these current sensing devices has one or more limitations. For example, the current shunt has to be physically large to handle high current measurements. Also, the use of the current shunt for high current measurements leads to excessive heating. Use of the current transformer as a current sensing device causes losses due to high current saturation, since the current transformer includes an iron core. In instances where a Hall Effect sensor is employed as the current sensing device, a large temperature drift is a major concern.

In addition to the abovementioned current sensing devices, a Rogowski current sensor may be employed for measuring magnetic fields generated by alternating or transient current. The traditional Rogowski current sensor includes a plurality of bobbins coupled in series, where many turns are wound on each bobbin. Although the Rogowski current sensor may provide a less expensive solution than other current sensing devices while being devoid of current saturation issues, the assembly of a traditional Rogowski coil entails a very labor intensive winding process, which can present accuracy and repeatability challenges keeping the cost of mass production higher than is desirable. Additionally, conventional Rogowski current sensors are not modular and therefore, cannot easily scale to sense multiple current levels.

BRIEF DESCRIPTION

In accordance with aspects of the present disclosure, a detecting unit is presented. The detecting unit includes a flexible circuit having a first side and a second side opposite the first side. The flexible circuit includes a plurality of cells defined therein, each of the plurality of cells having a first side and a second side respectively corresponding to the first side and the second side of the flexible circuit. Moreover, the flexible circuit includes a plurality of conductive windings disposed on at least one of the first and second sides of the plurality of cells. Further, the flexible circuit includes a stress reduction feature between each of the plurality of cells. Also, the detecting unit includes a sealing element configured to secure the flexible circuit in a stacked configuration.

In accordance with another aspect of the present disclosure, a sensing system is presented. The sensing system includes a rigid support structure. Further, the sensing system includes a plurality of detecting units disposed on the rigid support structure such that they are electrically coupled, where the plurality of detecting units includes a flexible circuit having a first side and a second side opposite the first side. The flexible circuit includes a plurality of cells defined therein, each of the plurality of cells having a first side and a second side respectively corresponding to the first side and second side of the flexible circuit. Furthermore, the flexible circuit includes a plurality of conductive windings disposed on at least one of the first and second sides of the plurality of cells. The flexible circuit includes a stress reduction feature between each of the plurality of cells. The plurality of detecting units includes a sealing element configured to secure the flexible circuit in a stacked configuration.

In accordance with yet another aspect of the present disclosure, a method of making a detecting unit is presented. The method includes printing a plurality of conductive windings on at least one side of a plurality of cells separated by cell boundaries and defined on a flexible circuit. Further, the method includes reducing a stress associated with the flexible circuit. Moreover, the method includes folding the flexible circuit proximate to the cell boundary in alternating fashion to form a stacked configuration, such that when folded, magnetic flux generated by the conductive windings are mutually additive; and securing the flexible circuit in the stacked configuration.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this specification belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean one, some, or all of the listed items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. Furthermore, terms "circuit" and "circuitry" and "controller" may include either a single component or a plurality of components, which are either active and/or passive and are connected or otherwise coupled together to provide the described function. Also, the term operatively coupled as used herein includes wired coupling, wireless coupling, electrical coupling, magnetic coupling, radio communication, software based communication, or combinations thereof.

As will be described in detail hereinafter, various embodiments of an exemplary system and method for current sensing are presented. Specifically, a detecting unit to be employed as a current sensing unit and configured to provide a modular current sensing system is presented. Employing one or more detecting units described hereinafter, a current sensing system with improved power density may be obtained. Moreover, manufacturing and fabrication process for assembling the detecting units of the current sensing system described herein is relatively simpler.

Figure 1:
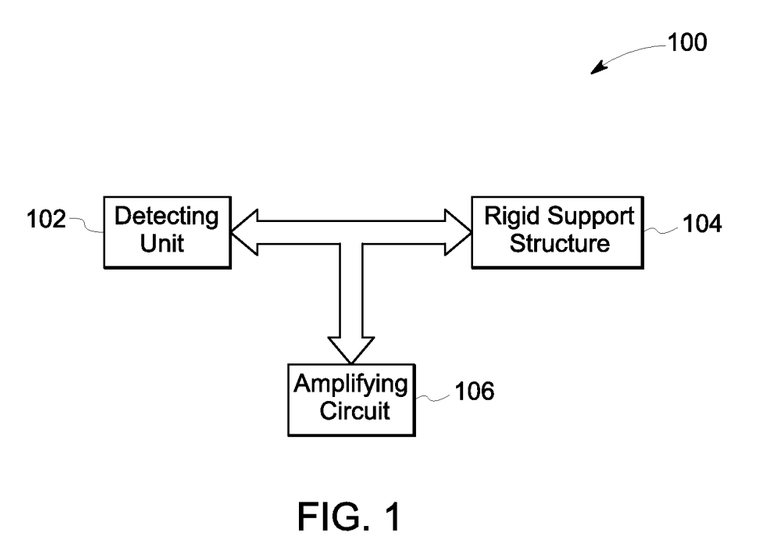
FIG. 1 is a diagrammatical representation of an exemplary current sensing system, according to embodiments of the present invention.

Turning now to the drawings and by way of example in FIG. 1, a diagrammatical representation 100 of an exemplary current sensing system, according to embodiments of the invention, is depicted. The current sensing system 100 may include a plurality of detecting units 102, a rigid support structure 104, and an amplifying circuit 106. Each detecting unit 102 may include a stacked configuration of a flexible circuit. The term 'stacked configuration' as used herein, may be used to refer to a two-dimensional flexible circuit that is formed into a three-dimensional unit. In one embodiment, the stacked configuration of the detecting unit 102 may be formed by folding the flexible circuit, for example, in a fanfold manner, whereas in another embodiment, the stacked configuration may be formed by separating cells from the flexible circuit and layering one atop the other in an aligned and electrically conductive manner. In one embodiment, a compact cubical or cuboidal structure may be obtained upon stacking the cells of the flexible circuit. In another embodiment, a cylindrical structure may be obtained upon stacking the cells of the flexible circuit.

The flexible circuit may include a first side and a second side, where the first side is opposite to the second side. In one example, the flexible circuit is a strip of a flexible printed circuit board (PCB), a flexible printed circuit (FPC), or a combination thereof. Moreover, the flexible circuit may have a plurality of cells defined therein where each of the cells includes at least one conductive winding. In one embodiment, the level of current that can be measured by the detecting unit 102 may be determined based on the number of cells defined on the flexible circuit. In addition, the number of cells may be different for different detecting units 102. Furthermore, a plurality of conductive windings may be printed on the plurality of cells defined on the flexible circuit. In one non-limiting example, the pattern of the conductive windings of the cells may vary across the cells. The structure of the detecting unit 102 and the method of making the detecting unit 102 will be explained in greater detail with respect to FIGS. 2-11.

Additionally, a plurality of the detecting units 102 may be disposed on the rigid support structure 104. In one example, the rigid support structure 104 is a rigid printed circuit board (PCB). The rigid support structure 104 may provide desired mechanical support and electrical support to the detecting units 102. Further, the output from the detecting units 102 mounted on the rigid support structure 104 may be provided to the amplifying circuit 106. The amplifying circuit 106 aids in amplifying the amplitude of electrical signals acquired at the output of the detecting units 102, so as to aid in precise measurement of the electrical signals. The term 'electrical signal' as used herein, may be used to refer to a current, a voltage, or power. The current sensing system 100 will be explained in greater detail with respect to FIG. 12. Furthermore, packaging of the current sensing system 100 will be explained in greater detail with respect to FIGS. 13 and 14.

Figure 2:
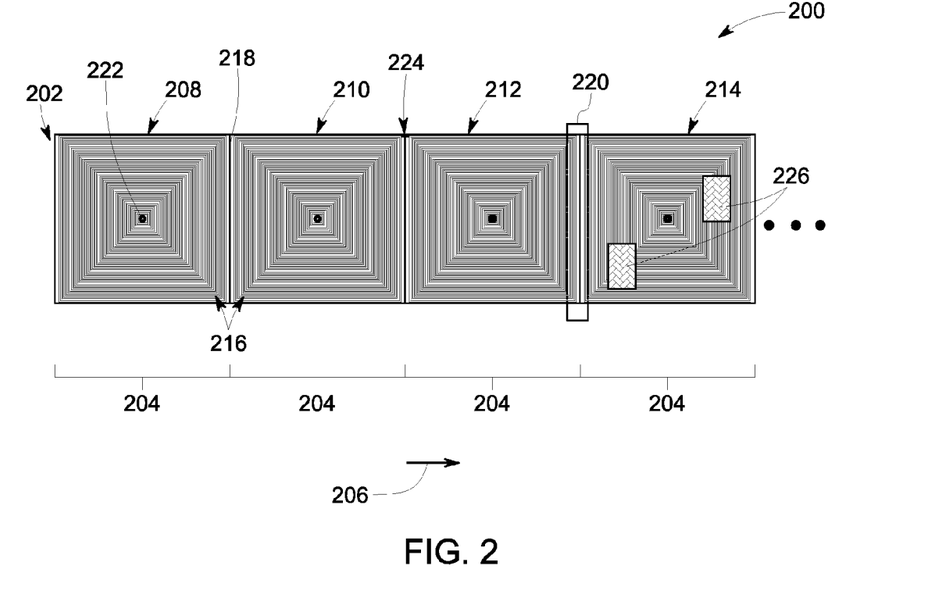
FIG. 2 is a diagrammatical representation of a first side of a flexible circuit of a detecting unit for use in the exemplary system of FIG. 1, according to embodiments of the present invention.
Figure 3:
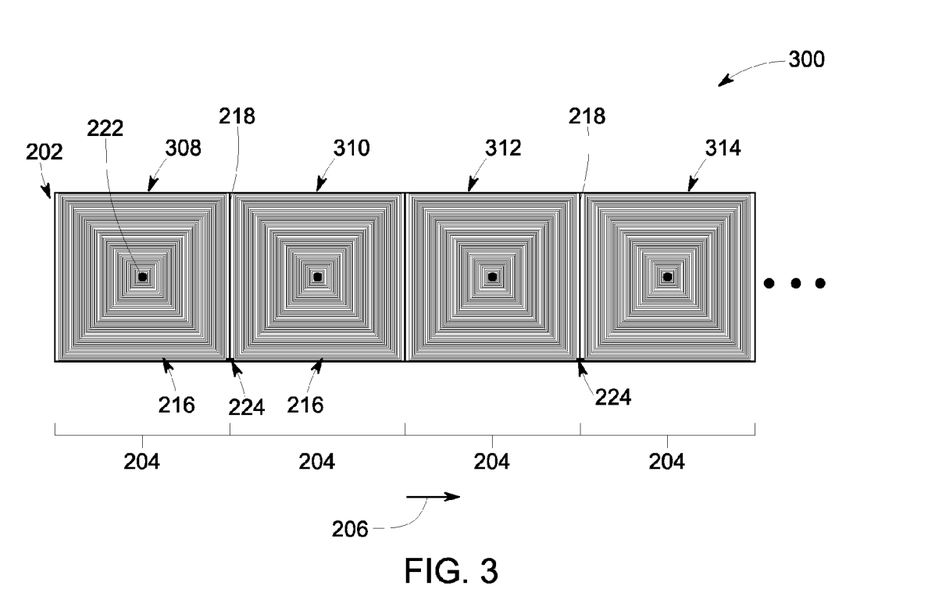
FIG. 3 is a diagrammatical representation of a second side of the flexible circuit of FIG. 2 for use in the exemplary system of FIG. 1, according to embodiments of the present invention.

Referring to FIGS. 2 and 3, a diagrammatical representation of a detecting unit, such as the detecting unit 102 for use in the exemplary system of FIG. 1, according to embodiments of the present invention, is presented. In particular, FIG. 2 is a diagrammatical representation of a first side 200 of a flexible circuit 202 used to form the detecting unit 102 and FIG. 3 is a diagrammatical representation of a second side 300 of the flexible circuit 202. The first side 200 and the second side 300 of the flexible circuit 202 may be positioned such that the first side 200 is opposite to the second side 300. Particularly, the first side 200 forms one surface of the flexible circuit 202 and the second side 300 forms the other surface of the flexible circuit 202. Moreover, the flexible circuit 202 may include a plurality of cells 204 defined therein, a plurality of conductive windings 216, a stress reduction feature 220, a plurality of connectors 222, and one or more connecting paths 224.

The term cell, as used herein, may be used to refer to an area defined on the flexible circuit 202, which includes one or more conductive windings 216 and are typically bounded by at least a portion of an edge of the flexible circuit 202 and/or at least one cell boundary 218. In one example, the plurality of cells 204 may have a square shape or a rectangular shape, however, other geometries of the cells are contemplated. The plurality of cells 204 may be defined adjacent to each other along a length 206 of the flexible circuit 202, in one non-limiting example. In another example, the cells may be defined in a two-dimensional array on the flexible circuit 202. Furthermore, each of the plurality of cells 204 has a first side and a second side, respectively corresponding to the first side 200 and the second side 300 of the flexible circuit 202. For ease of representation, in FIGS. 2 and 3, the flexible circuit 202 is shown to have four cells 204. Reference numerals 208, 210, 212, and 214 represent the first side of the four cells 204, whereas reference numerals 308, 310, 312, and 314, respectively represent the second side of the four cells 204.

In one embodiment, the conductive windings 216 are disposed on the plurality of cells 204. The conductive windings may be made of copper or another conductive material such that they generate a magnetic flux when energized by a current. One of the conductive windings 216 may be disposed on the first side of a cell 204 and another conductive winding may be disposed on the second side of that cell. Therefore, in one embodiment, each cell of the plurality of cells 204 may include at least two conductive windings. In a non-limiting example, the conductive windings 216 may be formed on each side of the cells in an Archimedean spiral configuration, a concentric square configuration, a concentric rectangle configuration, and the like. Other than the configurations mentioned herein, any other configurations of conductive windings which aid in covering the area of the cells 204 may be employed. The term conductive winding, as used herein, may refer to an electrical conductor, such as, a wire or conductive trace having loops or turns in the shape of a coil, spiral, or helix, for example. The conductive windings 216 may have any number of turns. Moreover, the conductive windings 216 may be of any geometry, shape, width, or thickness. With the increase in the number of turns, the density of turns in a cell increases. Accordingly, the magnetic flux corresponding to the cell increases. The forming of the conductive windings will be explained in greater detail with respect to the method of making the detecting unit, as described in FIG. 11.

The orientation of the conductive windings 216 on the first and second sides of each cell may be oriented in a similar manner such that current flowing in the conductive windings 216 generates a mutually additive magnetic flux when combined. As will be appreciated, if the orientation of the windings 216 on the first and second sides of the cell are different, it may cause a cancellation of flux, thereby impeding the measurement of the current. The orientations of the conductive windings 216 may include a clockwise orientation and a counter-clockwise orientation. Also, in the illustrated embodiment, the conductive windings 216 on adjacent cells alternate between a first orientation and a second orientation from one cell 204 to the next. Specifically, the orientation of one conductive winding on the first side of one cell may differ from the orientation of another conductive winding on the same side of an adjacent cell. For example, the orientation of the conductive winding 216 on the first side 208 of a first cell 204 is clockwise and the orientation of the conductive winding 216 on the first side 210 of an adjacent cell 204 is counter-clockwise. The orientation of the conductive windings 216 on either side of the plurality of cells 204 will be explained in greater detail with respect to FIGS. 4 and 5.

With continued reference to FIG. 2 and FIG. 3, each cell may be separated from an adjacent cell by a cell boundary 218. In one embodiment, one or more of the cell boundaries 218 may include a stress reduction feature 220. The stress reduction feature 220 may aid in minimizing stresses/forces occurring as a result of design, manufacture, or use of the flexible circuit 202. Furthermore, the stress reduction feature 220 may be designed such that upon stacking or folding the flexible circuit 202, any undesirable stress/force on the conducting windings 216 formed on the plurality of cells 204, the flexible circuit 202, or a combination thereof is minimized or otherwise reduced. In addition, the stress reduction feature 220 may be designed such that upon subsequent folding, stacking, or use of the flexible circuit 202, any undesirable stress/force on the conducting windings 216 formed on the plurality of cells 204, the flexible circuit 202, or a combination thereof is minimized. In one example, the stress reduction feature 220 aids in minimizing a restoring force upon folding or stacking the flexible circuit 202. In one embodiment, the stress reduction feature 220 may include a series of slits, holes, notches or other features scribed, stamped, cut, or otherwise created near or proximate to the cell boundary. Methods for creating the stress reduction feature 220 will be explained in greater detail with respect to FIG. 10.

Additionally, in one example, each cell of the plurality of cells 204 of the flexible circuit 202 has a connector 222 disposed at an inner point of the cell 204. In one example, the inner point on the surface of the cell may be a midpoint or a center point of the cell. However, the connector 222 may be placed on other positions of the cell based on the pattern of the conductive windings 216. The connector 222 aids in coupling one or more conductive windings 216 disposed on the first side 208 of a cell 204 and one or more conductive windings 216 disposed on the second side 308 of that cell 204 to provide a path for the current flowing from the conductive winding 216 on one side of the cell to the conductive winding 216 on the other side. In one embodiment, the connector 222 is a conductive via.

In addition, a connecting path such as the connecting path 224 is disposed between each cell of the plurality of cells 204, to electrically couple the one or more conductive windings 216 of one cell to the one or more conductive windings 216 on an adjacent cell. In particular, the connecting path 224 may be disposed on the first side 200 and/or the second side 300 of the flexible circuit 202. Moreover, the connecting path 224 disposed on the first side 200 and second side 300 of the flexible circuit 202 in combination with connectors 222 aids in providing a continuous path of current through the conductive windings 216 disposed on the cells 204 of the flexible circuit 202. In one embodiment, the connecting path 224 may be formed by soldering or dispensing a conductive material between two cells 204 defined on the flexible circuit 202, however other additive methods such as printing or subtractive methods such as etching may be used to form the connecting paths. In one example, the connecting path 224 may be formed simultaneously with the conductive windings 216, such that fabrication of the connecting path 224 is substantially similar to fabrication of the conductive windings 216.

The flexible circuit 202 may further include one or more electronic circuits. In one example, along with forming the plurality of conductive windings 216 on the plurality of cells 204, one or more electronic circuits 226 may also be formed on the flexible circuit 202. In one example, the electronic circuit 226 is an integrated circuit. In another example, the electronic circuit 226 may be an amplifying circuit, sensing electronics, or other analog or digital circuits or devices. Forming of the electronic circuits 226 directly on the flexible circuit 202 reduces the need for additional external electronic circuits to be mounted on or packaged along with the detecting unit for obtaining desired measurements.

The flexible circuit 202 may be stacked to form a detecting unit having a compact structure. In one embodiment, the flexible circuit may be folded to form a cubical or cuboidal structure. However, other geometries of the detecting unit are also contemplated. In particular, the plurality of cells 204 on the flexible circuit 202 may be folded in an alternating fashion along a cell boundary 218 proximate to the stress reduction feature 220. The pattern of folding the flexible circuit 202 will be explained in greater detail with respect to FIG. 6.

Figure 4:
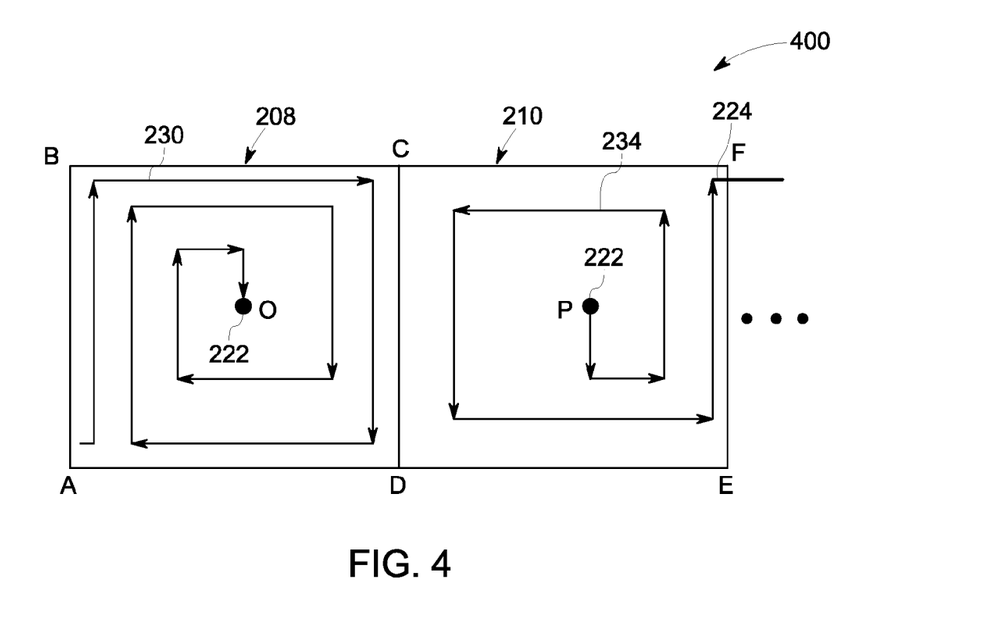
FIGS. 4 and 5 are diagrammatical representations of the orientation of conductive winding on the flexible circuit of a detecting unit for use in the exemplary system of FIG. 1, according to embodiments of the present invention.
Figure 5:
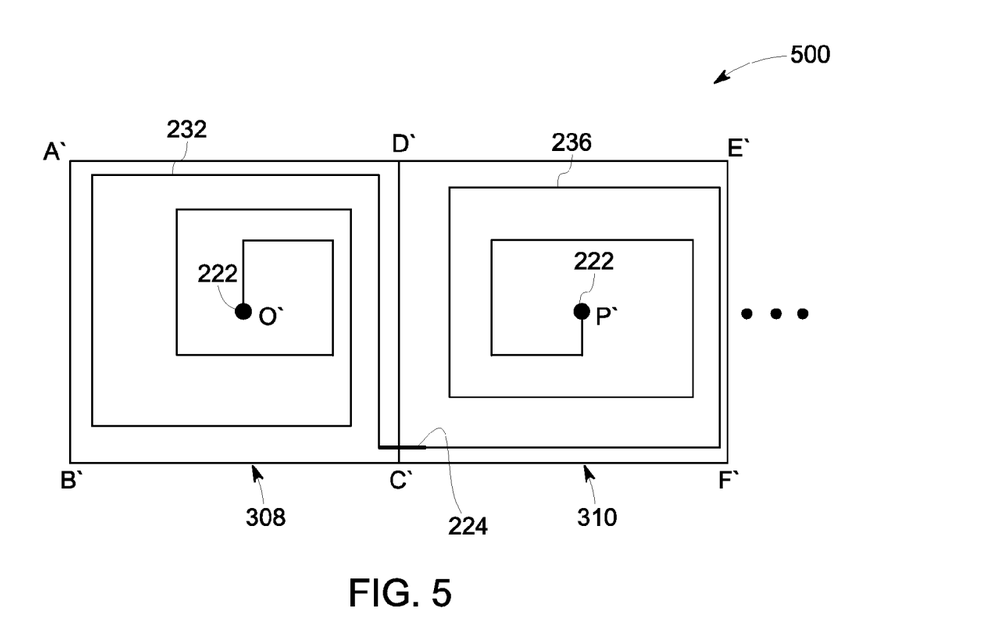

FIGS. 4 and 5 are diagrammatical representations showing exemplary orientations of conductive windings of a flexible circuit in accordance with embodiments of the present invention. In particular, FIG. 4 is a diagrammatical representation 400 of the orientation of a conductive winding on a first side of the flexible circuit of a detecting unit, such as the detecting unit 102 of FIG. 1. FIG. 5 is a diagrammatical representation 500 of the orientation of a conductive winding on a second side of the flexible circuit of FIG. 4. FIGS. 4 and 5 will be explained with respect to elements of FIGS. 2 and 3. More particularly, FIGS. 4 and 5 represent two cells 204 of the flexible circuit 202 represented in FIGS. 2 and 3 having first sides 208 and 210 and corresponding second sides 308 and 310.

For ease of explanation, the two cells 204 may be referred to as a first cell and a second cell. Furthermore, corner points A, B, C and D represent the first side 208 of the first cell and corner points C, D, E and F represent the first side 210 of the second cell. Moreover, corner points A', B' C' and D' represent the second side 308 of the first cell and corner points C', D' E' and F' represent the second side 310 of the second cell. The corner points A', B', C', and D' on the second side 308 of the first cell respectively correspond to the corner points A, B, C, and D on the first side 208 of the first cell. Similarly, the corner points C', D', E', and F' on the second side 310 of the second cell respectively correspond to the corner points C, D, E, and F on the first side 210 of the second cell. Furthermore, an inner point on the first side 208 of the first cell is represented as O and corresponding inner point on the second side 308 of the first cell is represented as O'. In a similar manner, an inner point on the first side 210 of the second cell is represented as P and corresponding inner point on the second side 310 of the second cell is represented as P'. As previously noted, the inner point may be a midpoint or a center point of a cell. Although both sides of the first and second cells may include conductive windings with a plurality of turns, for ease of representation, only few turns of the conductive windings are illustrated.

The conductive winding on first side 208 of the first cell may be represented by reference numeral 230 and the conductive winding on the first side 210 of the second cell may be represented by reference numeral 234. Also, reference numeral 232 may be representative of a conductive winding on second side 308 of the first cell and reference numeral 236 may be representative of the conductive winding on the second side 310 of the second cell. Additionally, a connector 222 through inner points O and O' electrically couples the conductive winding 230 on the first side 208 of the first cell with the conductive winding 232 on the second side 308 of the first cell. Similarly, the connector 222 through inner points P and P' electrically couples the conductive winding 234 on the first side 210 of the second cell and the conductive winding 236 on the second side 310 of the second cell. Also, a connecting path 224 couples the conductive windings 232, 236 of the first cell and the second cell near corner point C'. The conductive winding 234 on the first side 210 of the second cell may be further coupled to conductive windings of an adjacent cell via the connecting path 224 near corner point E. Similarly, conductive windings of each subsequent cell may be coupled to the conductive windings on adjacent cells throughout the flexible circuit 202.

Furthermore, in the illustrated embodiment, conductive winding 230 on the first side 208 of the first cell and conductive winding 232 on the second side 308 of the same cell are printed in an orientation such that the current flowing through the conductive windings generates a mutually additive flux when combined. More specifically, the conductive windings 230, 232 are printed in a clockwise direction on both first and second sides 208, 308 of the first cell. In one embodiment, the conductive winding 230 tracks from a point on an edge AB on the first side 208 inward to the inner point O, whereas the conductive winding 232 tracks outward from the inner point O' to a point on an edge C'D' of the second side 308.

Also, the conductive windings 234, 236 are printed in a counter-clockwise direction on both first and second sides 210, 310 of the second cell. For example, the conductive winding 236 tracks inward from the connecting path 224 near corner point C' to the inner point P' on the second side 310, whereas the conductive winding 234 tracks outward from the inner point P to a point on an edge FE of the first side 210. Thus, in accordance with one embodiment, the conductive windings 230, 232, 234, 236 along with connectors 220 and connecting paths 224 sets up a continuous path for flow of current from one side of the first cell to one side on the last cell of the flexible circuit 202.

Figure 6:
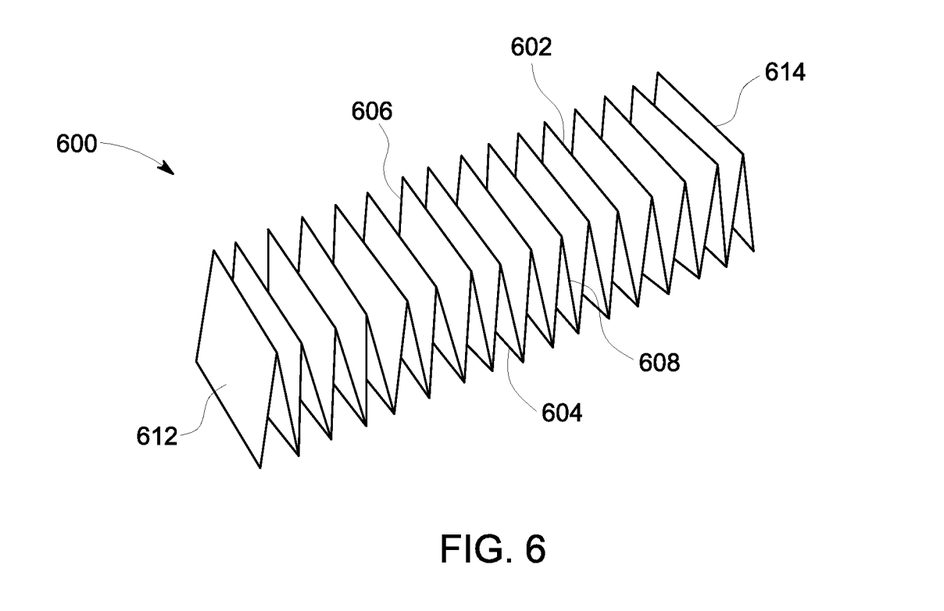
FIG. 6 is a diagrammatical representation of an embodiment of an exemplary detecting unit, according to embodiments of the present invention.

FIG. 6 is a diagrammatical representation 600 of an embodiment of an exemplary detecting unit, according to embodiments of the present invention. In particular, FIG. 6 illustrates a folded configuration of the flexible circuit 202 described with respect to elements of FIGS. 2 and 3. As previously described, the flexible circuit 202 includes a plurality of connectors 222, connecting paths 224, a plurality of conductive windings 216, and stress reduction features 220, and may be folded proximate to the stress reduction feature 220 in an alternating fashion to form detecting unit 600. The folding in alternate fashion may also be generally referred to as fan-folding or zigzag folding. In such a folded configuration, magnetic flux generated by the conductive windings 216 is mutually additive facilitating accurate sensing of current.

When folded, the detecting unit 600 may include six faces. Of the six faces, two faces 602, 604 may be formed predominantly by a combination of creases formed by folding of the flexible circuit 202. The other two faces 606, 608 may be formed by the remaining edges of the plurality of cells 204. In one example, face 612 may be formed by a first side of the first cell and face 614 may be formed by the first side of the last cell of the plurality of cells 204. In another example, the faces 612, 614 may be formed by a second side of the first and last cells of the plurality of cells 204. In yet another example, the face 612 may be formed by a first side of the first cell and the face 614 may be formed by a second side of the last cell or vice versa. Furthermore, the face 602 is opposite to the face 604, the face 606 is opposite to the face 608 and the face 612 is opposite to the face 614.

Figure 7:
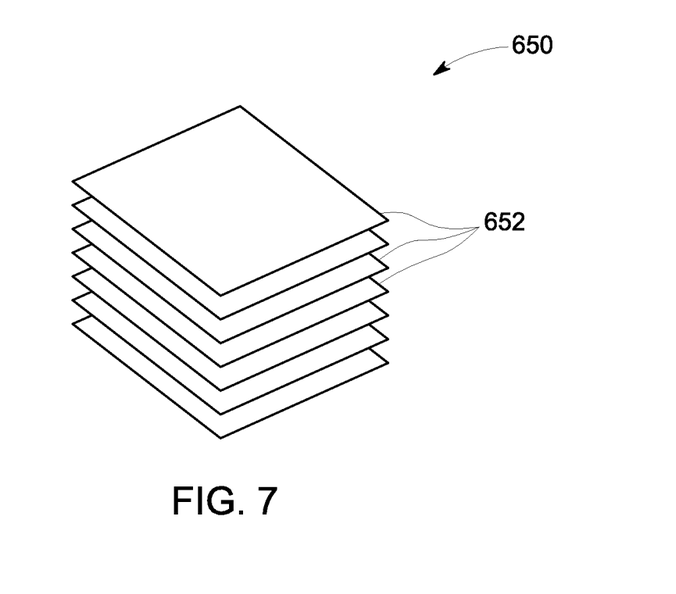
FIG. 7 is a diagrammatical representation of another embodiment of an exemplary detecting unit, according to embodiments of the present invention.

FIG. 7 is a diagrammatical representation 650 of another embodiment of an exemplary detecting unit, according to embodiments of the present invention. In particular, FIG. 7 illustrates an unfolded, stacked configuration of the plurality of cells, such as the cell 204 of the flexible circuit 202 of FIG. 2. In this embodiment, the plurality of cells 652 are separated from the flexible circuit and the cells 652 are layered one atop the other in an aligned and electrically conductive manner. Accordingly, the stacked cells 652 form the detecting unit 650.

Figure 8:
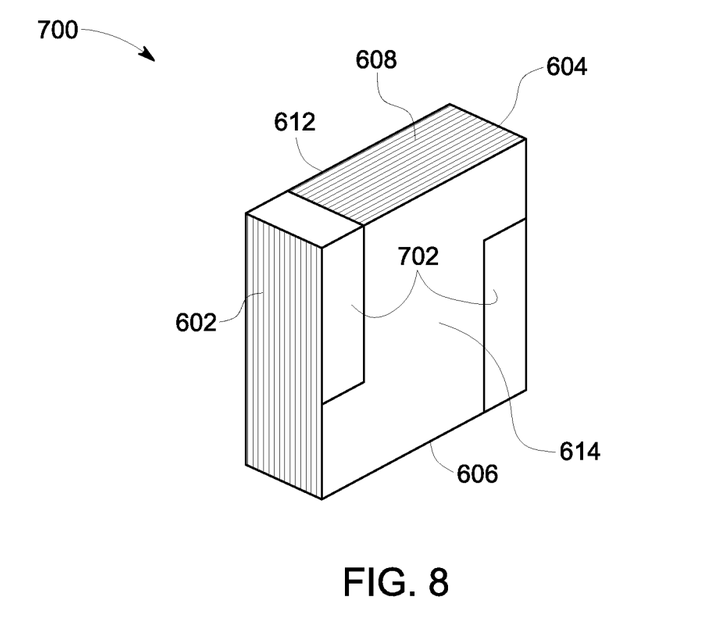
FIG. 8 is another diagrammatical representation of an exemplary detecting unit, according to embodiments of the present invention.

FIG. 8 illustrates one embodiment of a packaged configuration of a folded flexible circuit used in the detecting unit, such as detecting unit 102 of FIG. 1. For ease of explanation, FIG. 8 will be explained with reference to elements of FIGS. 2, 3, and 6. Once the flexible circuit 202 is folded in an alternating fashion as represented in FIG. 6, a cubical or cuboidal detecting unit 700 may be formed. Although the dimensions of the detecting unit 700 may vary depending upon application, in one embodiment, the width of faces 602, 604, 606, 608 may be about 4 mm, while the dimensions of faces 612, 614 may be about 12 mm by 12 mm Once the flexible circuit 202 is folded, a sealing element, such as an adhesive layer or a wrapping layer, may be employed for securing the flexible circuit 202 in the folded configuration.

In one example, an adhesive layer, such as one or more corner epoxy strips 702, may be fastened at the corners of the folded flexible circuit 202, so that the flexible circuit 202 is securely held in a folded configuration. In one example, the corner epoxy strip may extend from the face 612 to the face 614 via the face 606 and/or 608. In another example, the corner epoxy strip may extend from the face 612 to the face 614 via the face 602 and/or 604.

In another example, an adhesive layer such as a glue cover may be disposed over the conductive windings on both sides 200, 300 of the flexible circuit 202, such that upon folding or otherwise stacking the flexible circuit 202, the plurality of cells 204 of the flexible circuit 202 may be fastened to each other thereby securing the folded configuration of the flexible circuit 202. To the extent a glue cover is used, it may be, for example, used in addition to the corner epoxy strip 702 or in place of the corner epoxy strip 702. The glue cover will be shown in detail with respect to FIG. 10B.

Figure 9:
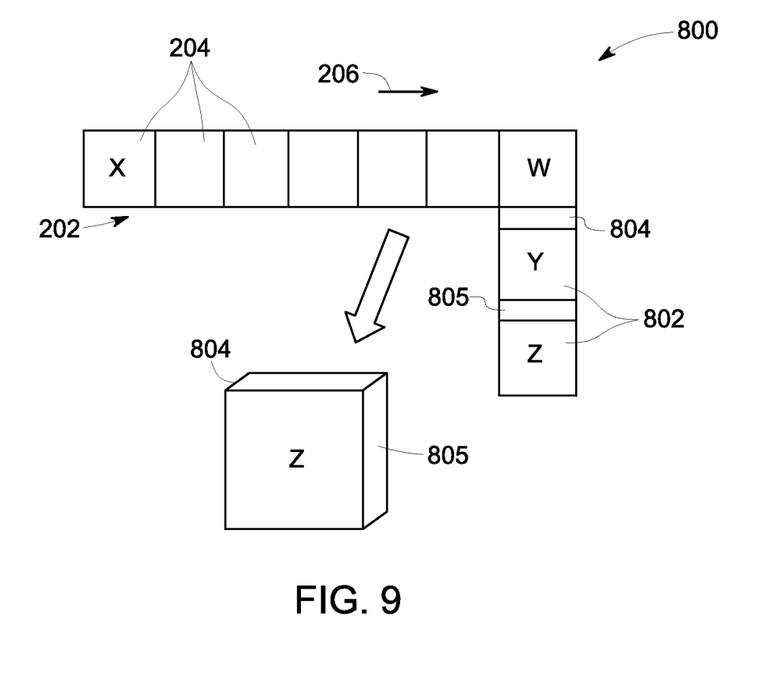
FIG. 9 is a diagrammatical representation of an exemplary detecting unit having one or more wrapping layers, according to embodiments of the present invention.

In one embodiment, instead of or in addition to the adhesive layers, a sealing element such as one or more wrapping layers may be employed such that the flexible circuit 202 retains the stacked configuration. Referring to FIG. 9, a diagrammatical representation 800 of an exemplary detecting unit, such as the detecting unit 102 of FIG. 1, having a sealing element in the form of one or more wrapping layers 802, according to embodiments of the present invention is depicted.

For ease of explanation, FIG. 9 will be explained with respect to the elements of FIGS. 2 and 3. Additionally, a first cell of the plurality of cells 204 defined on the flexible circuit 202 may be represented by X and the last cell of the plurality of cells 204 may be represented by W. The one or more wrapping layers 802 are further represented by wrapping layers Y and Z. In one example, the wrapping layers Y and Z may have substantially similar dimensions as the plurality of cells 204. Furthermore, as illustrated in FIG. 9, the wrapping layers Y and Z may be employed along with intermediate cells 804, 805. The intermediate cell 804 is disposed between the last cell W and first wrapping layer Y. Also, the intermediate cell 805 is disposed between the first wrapping layer Y and the second wrapping layer Z. In one example, the wrapping layers and the intermediate cells may be formed from the same piece of flexible circuit 202, such that wrapping layers and the intermediate cells are perpendicular to a length 206 of the flexible circuit 202. In another example, a combination of the wrapping layers and the intermediate cells may be coupled or otherwise affixed to the cell W by employing any adhesive material.

In the example of FIG. 9, upon folding the flexible circuit 202 in alternating fashion to form a stacked configuration, the wrapping layers Y and Z may be wrapped over the stacked flexible circuit such that the wrapping layer Y may cover one side of cell X and the wrapping layer Z may cover one side of cell W. Moreover, the intermediate cell 804 may overlap with one face of the detecting unit 800 and the intermediate cell 805 may overlap with other face of the detecting unit 800, such that the intermediate cell 804 is opposite to the intermediate cell 805.

Figure 10A:
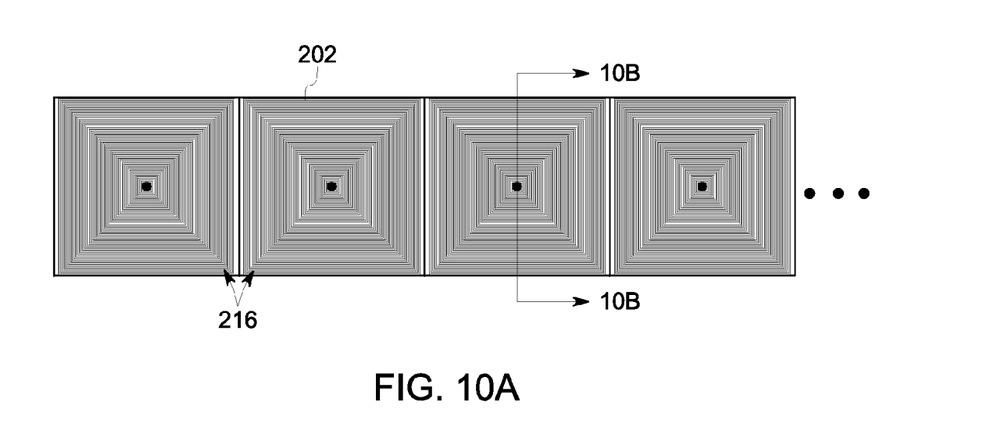
FIGS. 10A and 10B are diagrammatical representations of different views of the detecting unit for use in the exemplary system of FIG. 1, according to embodiments of the present invention.
Figure 10B:
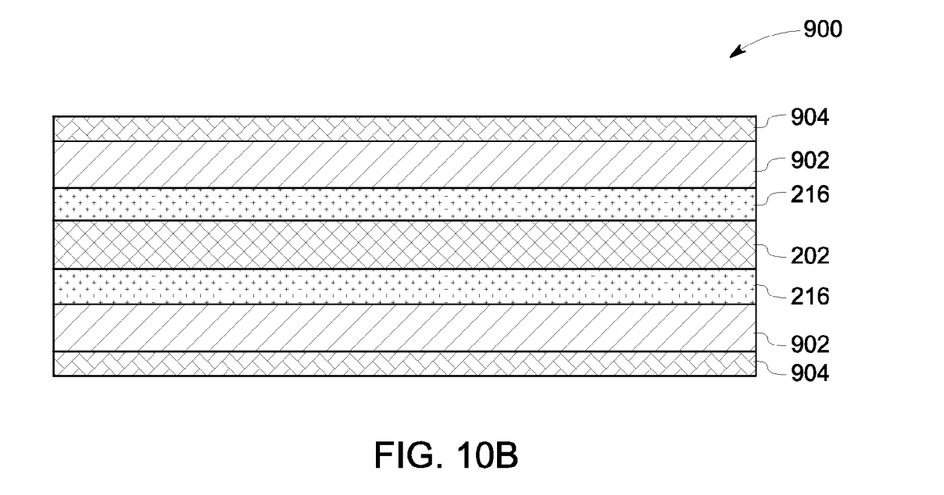

Turning now to FIGS. 10A and 10B, a diagrammatical representation of different views of a detecting unit, such as the detecting unit 102 of FIG. 1, according to embodiments of the present invention is presented. FIGS. 10A and 10B will be explained with respect to elements of FIGS. 2 and 3. In particular, FIG. 10A represents a detecting unit in an unstacked form, where the detecting unit includes a flexible circuit 202 having conductive windings 216. Moreover, FIG. 10B represents a cross-sectional view 900 (section 10B-10B) of the detecting unit of FIG. 10A. The cross-sectional view 900 of the detecting unit includes a flexible circuit 202. The flexible circuit 202 may be a dielectric medium. Further, the conductive winding 216 may be formed on both sides of the flexible circuit 202. Moreover, an adhesive layer such as a glue cover 902 may be disposed on the conductive winding 216. Furthermore, a covering layer 904 may be disposed on the glue cover 902, in one non-limiting example. In one embodiment, the covering layer 904 aids in holding securely the layer of glue cover 902 and the conductive winding 216. In another embodiment, the covering layer 904 may be configured to protect the glue cover 902 and the conductive winding 216 from any undesirable effects, such as, but not limited to vibrations. In one example, the covering layer may include a polymer coating, such as a polyvinyl coating or any other coating to protect the flexible circuit 202 and/or conductive windings 216 from environmental factors, such as but not limited to humidity, temperature, mechanical shock, vibration, erosion, and/or corrosives.

Figure 11:
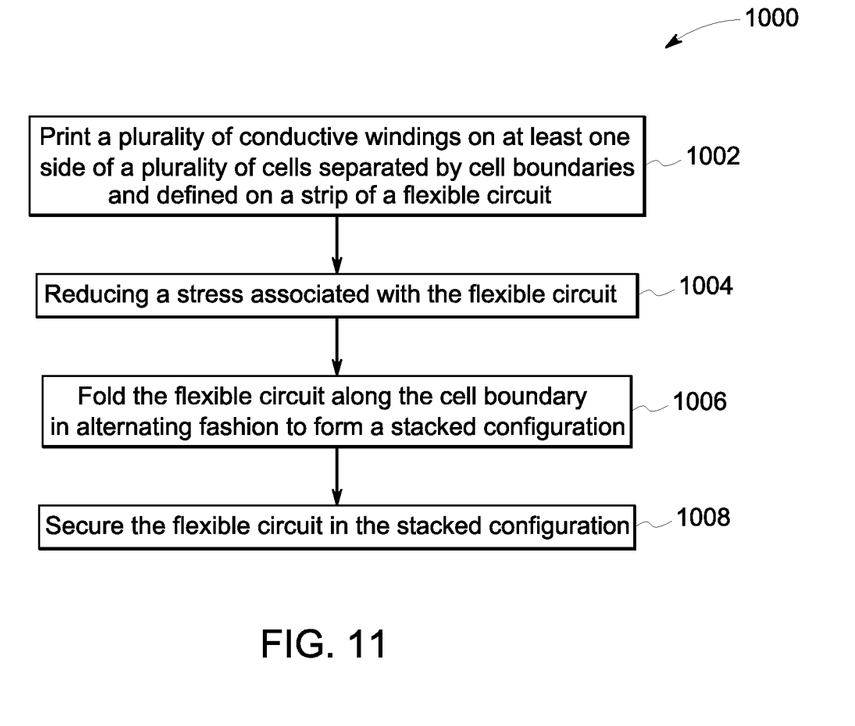
FIG. 11 is a flow chart representing an exemplary method of making the detecting unit, according to embodiments of the present invention.

Referring to FIG. 11, a flow chart 1000 representing an exemplary method of making the detecting unit, according to embodiments of the present invention is presented. The method of FIG. 11 will be explained with respect to elements of FIGS. 2 and 3. The method begins at block 1002 where a plurality of conductive windings 216 are printed on at least one side of a plurality of cells 204 separated by cell boundaries and defined on a flexible circuit 202. In a specific embodiment, a conductive winding 216 may be formed on each side of a cell of the plurality of cells 204.

In certain embodiments, the printing of the conductive winding may be executed employing an additive technique, such as printing, a subtractive technique, such as etching. In addition to additive techniques and subtractive techniques, the conductive windings may be printed using a hybrid technique. The hybrid technique may include a step of layering a conductive seed pattern on the flexible circuit 202. The conductive seed pattern may provide the pattern or the configuration for which the conductive winding needs to be printed. In one example, the conductive seed pattern may represent a pattern having a clockwise or counter-clockwise orientation of an Archimedean spiral configuration. Further, the additive technique of printing may include a step of plating a conductive element of desired thickness on the conductive seed pattern.

Furthermore, in one example, a connecting path 224 may be printed/soldered on the flexible circuit 202, such that, the conductive windings 216 of each cell are coupled to the conductive windings 216 of the adjacent cell. Also, a connector 222 may be placed at an inner point on the surface of the cell such that the conductive windings 216 on both sides of that cell are coupled to each other. In one embodiment, the electronic circuit 226 may be printed over the flexible circuit 202.

Referring back to FIG. 11, at block 1004, a stress associated with the flexible circuit 202 is reduced. In particular, the stress associated with the flexible circuit 202 is reduced to facilitate folding or otherwise stacking of the flexible circuit 202. In one embodiment, the reduction of the stress may include forming a stress reduction feature 220 along the cell boundary 218 between each of the plurality of cells 204. As noted hereinabove, the stress reduction feature 220 may include a series of slits, holes, notches or other features scribed, stamped, cut, or otherwise created near or proximate to the cell boundary. The stress reduction feature 220 may be formed by, for example, employing a laser, a mechanical scoring tool, a knife edge, a stylus, or combinations thereof.

The stress reduction feature 220 may aid in minimizing stresses/forces occurring as a result of design, manufacture, or use of the flexible circuit 202. In the event the flexible circuit is folded, the stress reduction feature 220 may be designed such that upon folding the flexible circuit 202, any undesirable stress/force on the conducting windings 216 printed on the plurality of cells 204 is minimized. Also, the stress reduction feature 220 may aid in reducing the restoring force upon folding or stacking the flexible circuit. In an alternative embodiment, the stress reduction feature may include a complete separation of the cells to eliminate the restoring force altogether. The cells then may be laid one upon the other to form a stack.

In addition, at block 1006, the flexible circuit 202 may be folded along the cell boundary in alternating fashion to form a stacked configuration as explained with reference to FIG. 6.

Additionally, at block 1008, the flexible circuit 202 in the folded configuration may be secured by means of a sealing element such as the adhesive layer, one or more wrapping layers, or combinations thereof as explained with respect to FIGS. 8 and 9.

Figure 12:
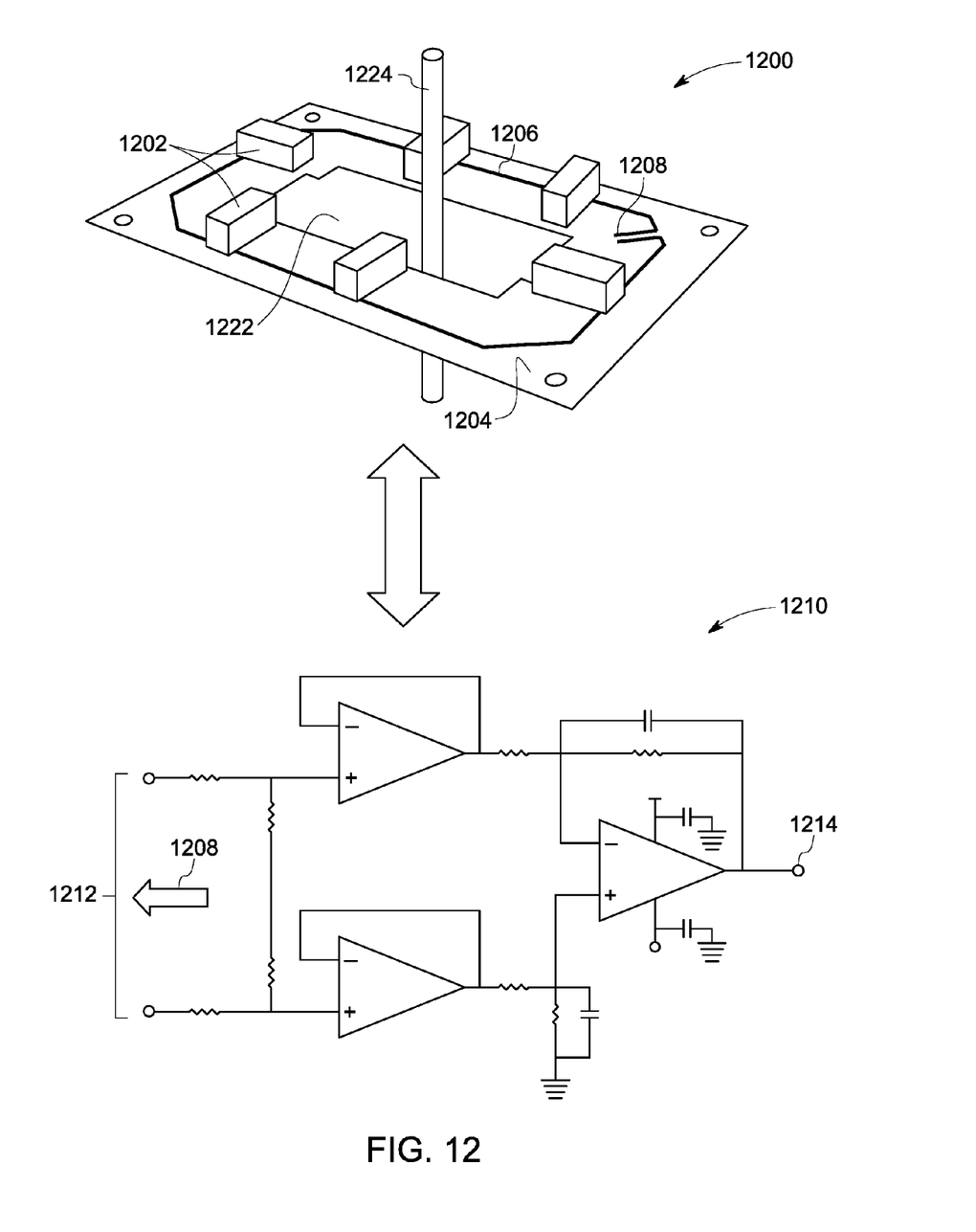
FIG. 12 is a detailed diagrammatical representation of an exemplary current sensing system of FIG. 1, according to embodiments of the present invention.

FIG. 12 is a detailed diagrammatical representation 1200 of an exemplary current sensing system of FIG. 1, according to embodiments of the present invention. The current sensing system 1200 may include a plurality of detecting unis 1202, a rigid support structure 1204, and an amplifying circuit 1210. The detecting unit 1202 may represent the detecting unit 600 of FIG. 6. In the example of FIG. 12, the current sensing system 1200 includes six detecting units 1202 operatively coupled to the rigid support structure 1204, however the number of detecting units can vary. In one embodiment, the rigid support structure 1204 may include a rigid PCB. Also, the rigid support structure 1204 may have a hollow space 1222 at its center portion through which a current carrying conductor 1224 to be sensed may be placed, in one example.

Furthermore, a conductive trace 1206 is formed on the rigid support structure 1204 to provide a conducting path between the plurality of detecting units 1202. The conductive trace 1206 may be formed, for example, by depositing, printing, or etching a conductive metal on the rigid support structure 1204. Moreover, a sensing terminal 1208 may be formed on the rigid support structure 1204. In one embodiment, the sensing terminal 1208 may be formed by employing two ends of the conductive trace 1206. The output electrical signal generated by the plurality of detecting units 1202 may cumulatively appear across the sensing terminal 1208.

In addition, the amplifying circuit 1210 may be operatively coupled to at least one of the plurality of detecting unis 1202, the rigid support structure 1204, and the conductive trace 1206. In one example, the amplifying circuit 1210 may be disposed on the rigid support structure 1204. Also, the output electrical signal at the sensing terminal 1208 may be provided to input terminal 1212 of the amplifying circuit 1210. The amplifying circuit 1210 may include a plurality of passive electronic components and a plurality of active electronic components, such as, an operational amplifier. The amplified output may be acquired at the output terminal 1214 of the amplifying circuit 1210. The amplification of the electrical signal obtained at the sensing terminal 1208 may aid in enhancing the current detection capability of the current sensing system 1200. In one example, even low value of currents can be sensed effectively by employing the amplifying circuit 1210.

Figure 13:
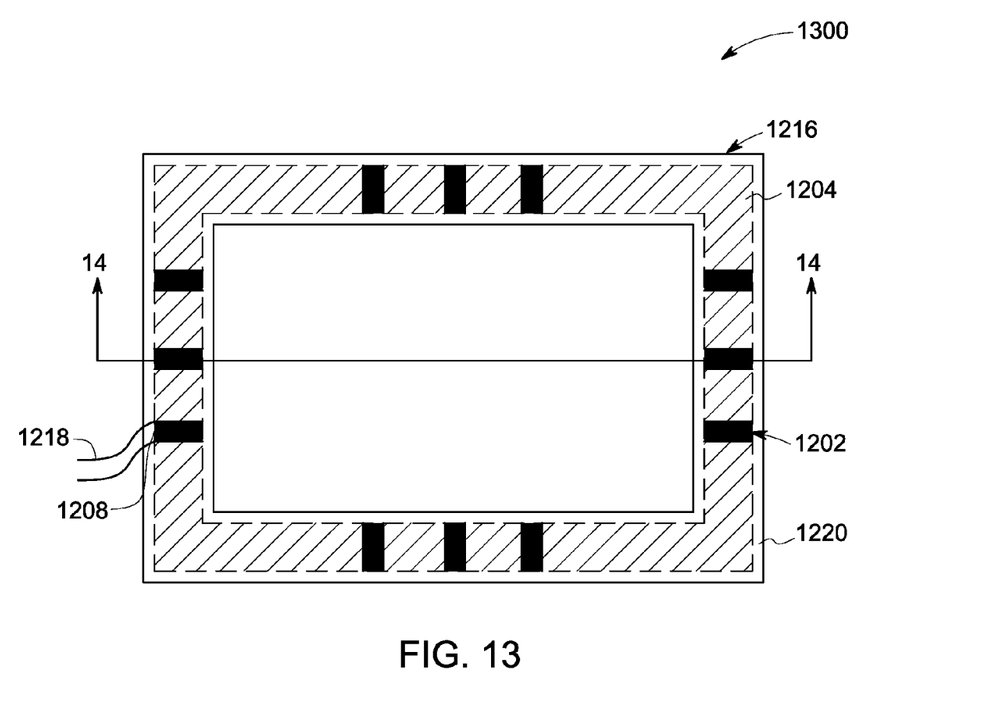
FIGS. 13 and 14 are diagrammatical representations of different views of an exemplary packaged current sensing system of FIG. 1, according to embodiments of the present invention.
Figure 14:
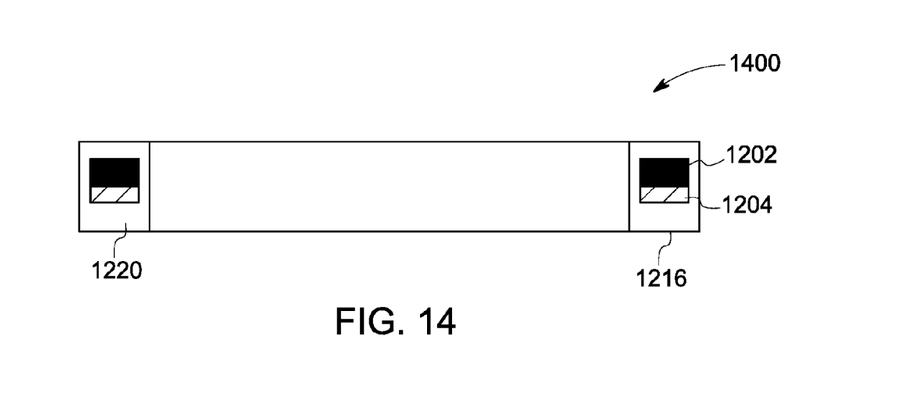

FIGS. 13 and 14 are diagrammatical representations of different views of an exemplary packaged current sensing system of FIG. 1, according to embodiments of the present invention. Specifically, FIG. 13 represents a top view 1300 of a packaged current sensing system. Furthermore, FIG. 14 represents a sectional view 1400 of the packaged current sensing system. For ease of explanation, FIGS. 13 and 14 will be described with respect to FIG. 12.

Referring to FIG. 13, a packaging unit 1216 may be provided to securely package the current sensing system 1200. This packaging unit 1216 may form a housing, such that the rigid support structure 1204 and the plurality of detecting units 1202 on the rigid support structure 1204 are securely covered inside the packaging unit 1216. In one embodiment, the packaging unit 1216 may include an encapsulation or a supporting case. Moreover, the packaging unit 1216 may be provided with a provision to couple the sensing terminals 1208 to an amplifying circuit 1210, where the amplifying circuit 1210 may be disposed outside the packaging unit 1216. In one embodiment, the packaging unit 1216 may be designed such that the packaging unit 1216 may slide around a busbar 1218 that carries the electrical signal from the sensing terminal 1208 to the amplifying circuit 1210. Furthermore, the packaging unit 1216 may be filled with a compound 1220 which provides electrical isolation for detecting units 1202 and the rigid support structure 1204. This compound 1220 may be epoxy or any other potting material, in one non-limiting example.

FIG. 14 is a sectional view 1400 of the packaged current sensing system at the section 14-14 of FIG. 13. The sectional view 1400 depicts the rigid support structure 1204 and the plurality of detecting units 1202 entirely enclosed inside the packaging unit 1216. Furthermore, the sectional view of packaged current sensing system depicts the compound 1220 filled in the packaging unit 1216.

The various embodiments of the detecting unit and the method of making the detecting unit described hereinabove aids in providing a current sensing system with enhanced sensitivity and power density. Since the detecting unit employs a flexible circuit instead of the rigid PCB, the current sensing system of the present disclosure has improved sensitivity of 1.17 mV/A when compared to current sensing system made of detecting units employing rigid PCBs, which has a sensitivity of 0.9-0.8 mV/A. Moreover, since flexible PCB is employed for making the detecting unit the process of assembling and manufacture of the detecting unit is relatively simpler and cheaper. Also, the number of cells in the flexible circuit can be modified and hence, the sensitivity of the current sensing system is improved considerably. In addition, since this current sensing system provides a modular solution, the number of detecting units on the rigid support structure may be varied to vary the level of current to be measured. Furthermore, the various embodiments of the current sensing system may find applications in circuit breakers and other industrial solution applications. Also, the current sensing system may be employed in medical systems such as but not limited to magnetic resonance imaging (MRI) systems.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof.

The invention claimed is:

1. A sensing system comprising:

a rigid support structure having a hollow space at a center portion;

a plurality of detecting units disposed on the rigid support structure such that they are electrically coupled, wherein the plurality of detecting units comprises:

a flexible circuit having a first side and a second side opposite the first side, the flexible circuit comprising
 a plurality of cells defined therein, each of the plurality of cells having a first side and a second side respectively corresponding to the first side and second side of the flexible circuit;
 a plurality of conductive windings disposed on at least one of the first and second sides of the plurality of cells;
 a stress reduction feature between each of the plurality of cells;
a sealing element configured to secure the flexible circuit in a stacked configuration;

a packaging unit disposed surrounding the rigid support structure and the plurality of detecting units, wherein the packaging unit is filled with a compound to provide electrical isolation for the plurality of detecting units and the rigid support structure; and a current carrying conductor extending through the hollow space of the rigid support structure.

2. The sensing system of claim 1, further comprising a conductive trace disposed on the rigid support structure to provide a conducting path between the plurality of detecting units.

3. The sensing system of claim 1, further comprising an amplifying circuit operatively coupled to the plurality of detecting units.

4. The sensing system of claim 3, wherein the amplifying circuit is disposed on the rigid support structure.

5. The sensing system of claim 1, wherein the plurality of detecting units further comprise one or more electronic circuits disposed on the flexible circuit.

* * * * *